(12) United States Patent
Li et al.

(10) Patent No.: US 11,830,828 B2
(45) Date of Patent: Nov. 28, 2023

(54) SYSTEM AND METHOD FOR DETECTION OF DEFECTS IN SEMICONDUCTOR DEVICES

(71) Applicant: WESTERN DIGITAL TECHNOLOGIES, INC., San Jose, CA (US)

(72) Inventors: Liang Li, Shanghai (CN); Kevin Hu, Shanghai (CN); Wendy Yu, Shanghai (CN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 374 days.

(21) Appl. No.: 17/203,271

(22) Filed: Mar. 16, 2021

(65) Prior Publication Data

US 2022/0302049 A1    Sep. 22, 2022

(51) Int. Cl.
*H01L 23/58*    (2006.01)
*H01L 21/66*    (2006.01)
*B82Y 40/00*    (2011.01)

(52) U.S. Cl.
CPC ............ *H01L 23/585* (2013.01); *H01L 22/34* (2013.01)

(58) Field of Classification Search
CPC .......... B82Y 40/00; B82Y 35/00; H10B 41/35
See application file for complete search history.

(56) References Cited

U.S. PATENT DOCUMENTS

| 2013/0134560 | A1* | 5/2013 | Wholey | H01L 23/564 |
| | | | | 257/629 |
| 2013/0248859 | A1* | 9/2013 | Frye | G01R 31/2858 |
| | | | | 257/E21.531 |
| 2014/0145272 | A1* | 5/2014 | Or-Bach | H01L 27/0688 |
| | | | | 257/369 |
| 2020/0103462 | A1* | 4/2020 | Periyannan | G11C 29/006 |
| 2020/0150174 | A1* | 5/2020 | Kumar | H05K 1/0254 |
| 2020/0219826 | A1* | 7/2020 | Wu | H01L 23/5386 |

* cited by examiner

*Primary Examiner* — Jermele M Hollington
*Assistant Examiner* — Temilade S Rhodes-Vivour
(74) *Attorney, Agent, or Firm* — Morgan, Lewis & Bockius LLP

(57) ABSTRACT

An apparatus for detecting the presence of assembly related defects on a semiconductor device including an edge ring having a resistance value and including one or more layers configured to at least partially cover the semiconductor device in a first direction. The one or more layers are divided into a first section and a second section. Each layer of the one or more layers are in electrical communication with one another. The resistance value of the edge ring is at a first resistance value associated with the first and second sections being intact. At least one of the first section and second section is configured to break in response to an assembly related defect, and the resistance value of the edge ring is configured to change from the first resistance value to a second resistance value in response to at least one of the first and second sections being broken.

15 Claims, 8 Drawing Sheets

SYSTEM AND METHOD FOR DETECTION OF DEFECTS IN SEMICONDUCTOR DEVICES

BACKGROUND

The present disclosure generally relates to semiconductor memory devices (e.g., NAND flash devices) and manufacture thereof and, more particularly, to a semiconductor device having an edge multi-layer ring structure configured for early defect detection in the manufacturing process.

Semiconductor memory devices, including flash memory, and controllers thereof typically utilize memory cells to store data as an electrical value, such as an electrical charge or voltage. A memory cell, for example, may include a single transistor with a floating gate that is used to store a charge representative of a data value. The memory cells may be housed within a NAND chip, also referred to as a NAND die or a die. A non-volatile data storage device is a memory that can be electrically erased and reprogrammed. More generally, non-volatile memory (e.g., flash memory, as well as other types of non-volatile memory implemented using any of a variety of technologies) retains stored information even without power, as opposed to volatile memory, which requires power to maintain the stored information. During the assembly process, defects may occur in the NAND dies that cause electrical failures, a reduction in overall yield, and/or overall reliability concerns with the assembled memory device.

With the increase in products and computer technology that require large amounts of data storage such as, artificial intelligence (AI), internet of things (IOT), and autonomous vehicles, becoming more popular, the demand for storage space has increased exponentially. For example, one autonomous vehicle may generate around 400 GB of data per day. In order to accommodate for the increasing data storage requirements of these new technologies, NAND flash storage devices are often used. NAND flash storage devices offer advantages for storage usage, such as non-volatility of stored data, high endurance, resistance to mechanical shock, and cost effectiveness. In the manufacture of NAND flash storage devices, the backend assembly process plays a key role in the storage device manufacturing chain.

During a NAND flash assembly process, die crack, die chipping and die peeling are common defects that result from the assembly process. These kinds of defects not only reduce the overall usable yield, but also lead to increased defective parts per million (DPPM) and may cause an increase in the reliability concern of the finished product. One such reason is that the signals close to the die seal ring can be broken by these assembly defects, causing corresponding circuits in the NAND die to malfunction. However, assembly defects, even the same assembly defect, at different locations on the NAND die may cause totally different electrical symptoms.

Assembly defects may lead to an increase in time, effort, and resources resulting from troubleshooting conducted to identify the root cause of the assembly defect. Additionally, some marginal assembly defects may not lead to an immediate failure but may lead to a failure at some point during the storage device's lifetime. Furthermore, during assembly, there often is no straightforward indicator that shows the effectiveness of countermeasures included to reduce assembly defects. Therefore, there is a need to provide a system and/or method of detecting and classifying assembly defects accurately and early in the assembly of such NAND memory devices.

SUMMARY

In one embodiment there is an apparatus for detecting the presence of assembly related defects on a semiconductor device. In some embodiments, the apparatus includes an edge ring having a resistance value. In some embodiments, the edge ring includes one or more layers configured to at least partially cover a semiconductor device in a first direction, the one or more layers divided into a first section and a second section. Each layer of the one or more layers are in electrical communication with one another. The resistance value of the edge ring is at a first resistance value associated with the first section and second section being intact, at least one of the first section and second section configured to break in response to an assembly related defect. The resistance value of the edge ring is configured to change from the first resistance value to a second resistance value in response to at least one of the first section and second section being broken.

In some embodiments, the edge ring further includes a first terminal layer disposed on a first end of the one or more layers, and a second terminal layer disposed on a second end of the one or more layers opposite the first end. In some embodiments, the second resistance value is greater than the first resistance value. In some embodiments, the second resistance value is about double the first resistance value. In some embodiments, the resistance value of edge ring is configured to change from the first resistance value to a third resistance value in response to the first section and second section being broken. In some embodiments, the third resistance value is greater than the first resistance value. In some embodiments, the one or more layers includes at least 6 layers. In some embodiments, the edge ring is disposed interior to a seal ring of the semiconductor device. In some embodiments, the edge ring contacts the seal ring. In some embodiments, the first terminal layer, first section, and a first portion of the second terminal layer are connected in series. In some embodiments, the first terminal layer, second section, and a second portion of the second terminal layer are connected in series. In some embodiments, each of the one or more layers is made of an electrically conductive material. In some embodiments, for example, the one or more layers are comprised of any one of polycrystalline silicon (polysilicon), tungsten, copper, and aluminum.

In another embodiment there is an apparatus for detecting the presence of assembly related defects on a semiconductor device. The apparatus includes enclosure means for at least partially covering a semiconductor device in at least one direction, the enclosure means having a resistance value, terminal means for providing a connection to electrical testing means for measuring an electrical resistance of the enclosure means, and electrical communication means for providing electrical communication within the enclosure means and terminal means. The resistance value of the enclosure means is at a first resistance value associated with the enclosure means being intact, the enclosure means configured to break in response to an assembly related defect. The resistance value of the enclosure means is configured to change from the first resistance value to a second resistance value in response to the enclosure means being broken.

In some embodiments, the second resistance value is greater than the first resistance value. In some embodiments, the second resistance value is about double the first resistance value. In some embodiments, the terminal means includes a first terminal means and a second terminal means for providing a connection to the electrical testing means. In some embodiments, the electrical communication means provides electrical communication between the first terminal means, the enclosure means, and the second terminal means.

In another embodiment, there is a method of detecting assembly related defects of a semiconductor device. The method includes the steps of: providing an edge ring having a resistance value, the edge ring including one or more layers configured to at least partially cover a semiconductor device in a first direction, the one or more layers divided into a first section and a second section. Each layer of the one or more layers are in electrical communication with one another, the resistance value of the edge ring being at a first resistance value associated with the first section and second section being intact, at least one of the first section and second section configured to break in response to an assembly related defect. The resistance value of the edge ring is configured to change from the first resistance value to a second resistance value in response to at least one of the first section and second section being broken. The method further including the steps of determining a measured resistance value of the edge ring, comparing the measured resistance value to the first resistance value to determine a resistance difference value. The method further including the steps of in response to the resistance difference value being less than or equal to a first predetermined threshold, determining that no assembly defect has occurred on the semiconductor device, and in response to resistance difference value being greater than the first predetermined threshold, determining that an assembly defect has occurred on the semiconductor device.

In some embodiments, the semiconductor device includes an integrated chip configured to determine the measured resistance value. In some embodiments, the method further includes providing an external pad for determining the measured resistance value, the external pad being external to the semiconductor device.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

In the drawings.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1A:
FIG. 1A is a magnified view of an example of a die crack defect in a NAND flash storage device.
Figure 1B:
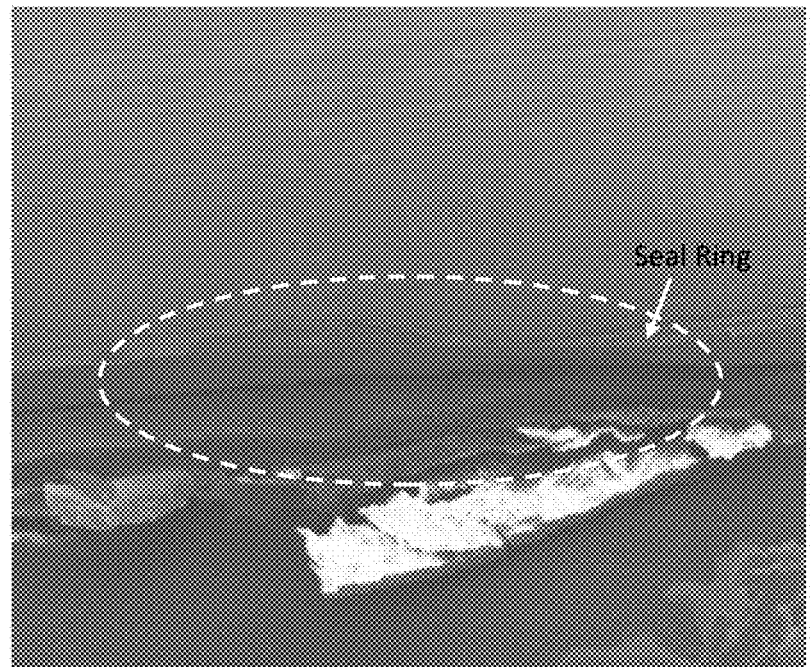
FIG. 1B is a magnified view of an example of a die chipping defect in a NAND flash storage device.
Figure 1C:
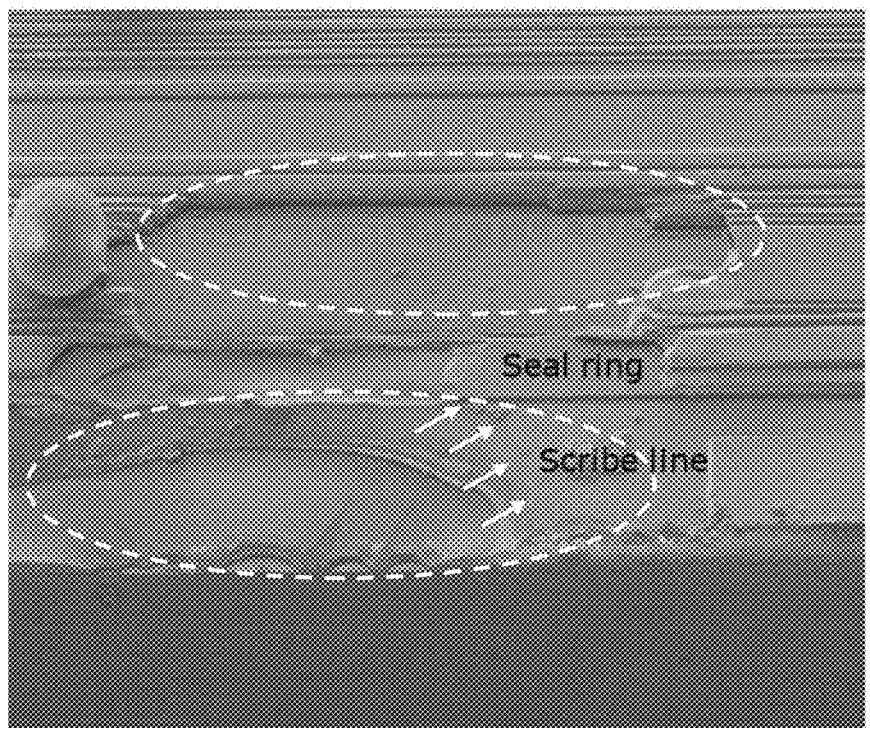
FIG. 1C is a magnified view of an example of a die peeling defect in a NAND flash storage device.
Figure 2A:
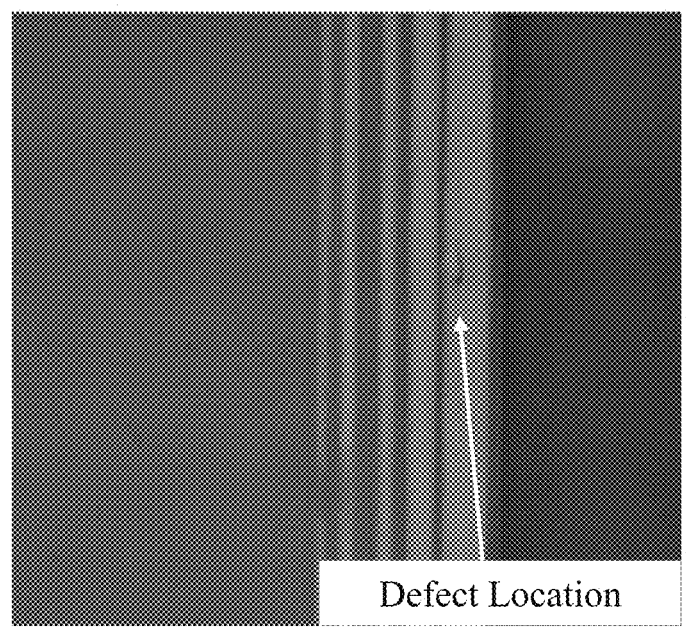
FIG. 2A is a magnified view of a defect detected during a biased highly accelerated stress test (BHAST) on a conventional NAND device.
Figure 2B:
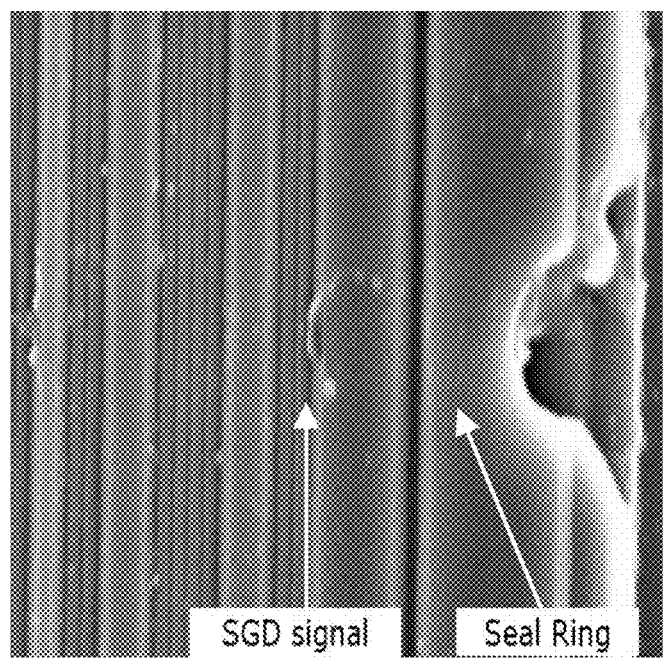
FIG. 2B is a magnified view of FIG. 2A showing the defect in the NAND device.

Referring to FIGS. 1A-1C, there is shown examples of die edge assembly defects in semiconductor devices, specifically NAND flash devices, caused during assembly of the semiconductor device. FIG. 1A is a micrograph that illustrates an example of a die crack defect caused during an assembly process. In the example shown here, the die crack extends transverse to the seal ring of the NAND flash device causing the seal ring to be broken where the crack extends through the seal ring. FIG. 1B is a micrograph that illustrates an example of a die chipping defect caused during an assembly process. In the example shown here the die chipping defect extends transverse to the seal ring. FIG. 1C is a micrograph that illustrates an example of a die peeling defect caused during an assembly process. In this example, the die peeling defect has occurred in multiple locations including along the seal ring and scribe line. Existing methods of detecting defects, such as the defects shown in FIGS. 1A-1C may include post-assembly testing, which is discussed further below. Referring to FIGS. 2A-2B there is shown an example of a defect not detected during existing out of factory testing methods. In this example, the NAND die shown, failed during a temperature humidity bias/biased highly accelerated stress test (BHAST) which is configured to predict a NAND dies lifetime under customer use. These marginal assembly defect cannot be captured by current factory testing method and structure. However, such defects may cause the quality related failure and/or accidents when the NAND die is in use.

As indicated above, existing methods and systems for detection of assembly related defects often rely on post assembly tests. During post assembly testing, NAND dies which fail to pass quality tests are placed into "soft bins" to correlate the defects to assembly related defects. However, this type of soft bin testing often mixes device level failures with defects caused during the assembly process. In this type of testing, it can take additional time and resources to determine if failures are caused by device level failures or defects caused during the assembly process. For example, power-on-read (POR) testing may be performed during soft bin testing. POR testing may be designed to check data integrity issues instead of assembly related issues. In practice, POR failures may not only be caused by device related issues. Examples of device related issues may include: first Romfuse Vt downshift, Romfuse WL-WL leaky, or Romfuse WL-MH leaky. Therefore, additional time, effort, and resources (e.g., one or more engineers allocated with 2-3 weeks of work time and 3 months of lead time) may be required in order to identify whether NAND die issues in the soft bin are caused by assembly defects or device issues. Furthermore, in the existing methods, subsequent correlations based on an assumed ratio from the limited sample size used for quality testing is required. Such subsequent correlations may not always be accurate and may be, in some instances, misleading as to the cause of the failure during quality testing. One such root cause for this problem in this process of quality testing and subsequent correlation is that no dedicated on-die structure exists which can be used to directly detect and indicate assembly related failures/defects.

Referring to the drawings in detail, wherein like reference numerals indicate like elements throughout, there is shown in FIGS. 3-5B a multi-layer edge ring for a semiconductor device (e.g., a NAND device, a 3D NAND device), generally designated 100, in accordance with an exemplary embodiment of the present disclosure.

Figure 3:
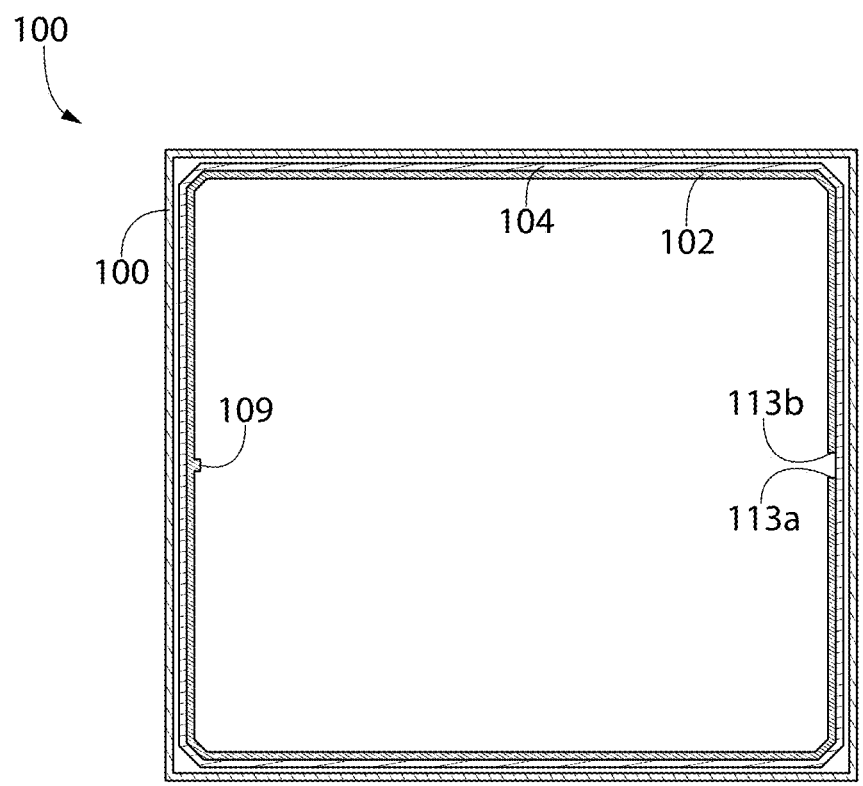
FIG. 3 is a schematic plan view of a multi-layer edge ring for a semiconductor device (e.g., NAND device, 3D NAND device) in accordance with an exemplary embodiment of the present disclosure.
Figure 4A:
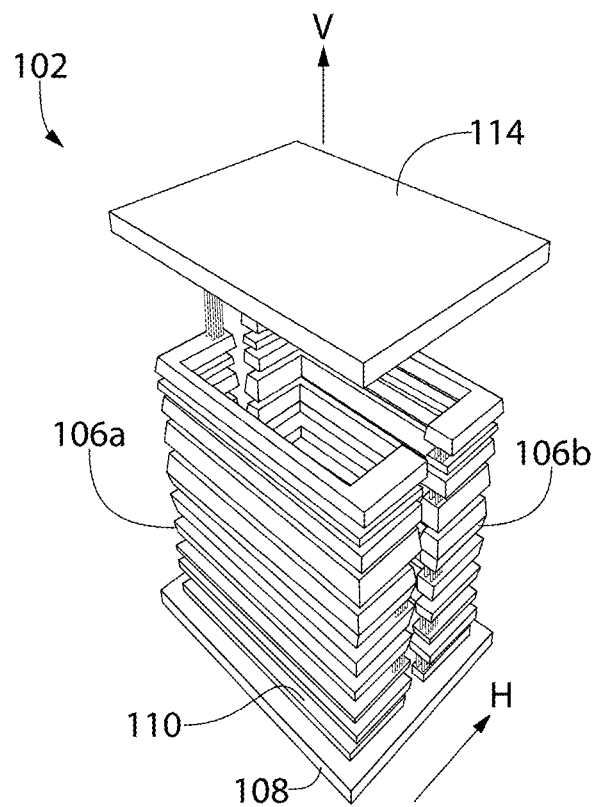
FIGS. 4A-4B are perspective views of a multi-layer edge ring for a semiconductor device in accordance with an exemplary embodiment of the present disclosure.
Figure 4B:
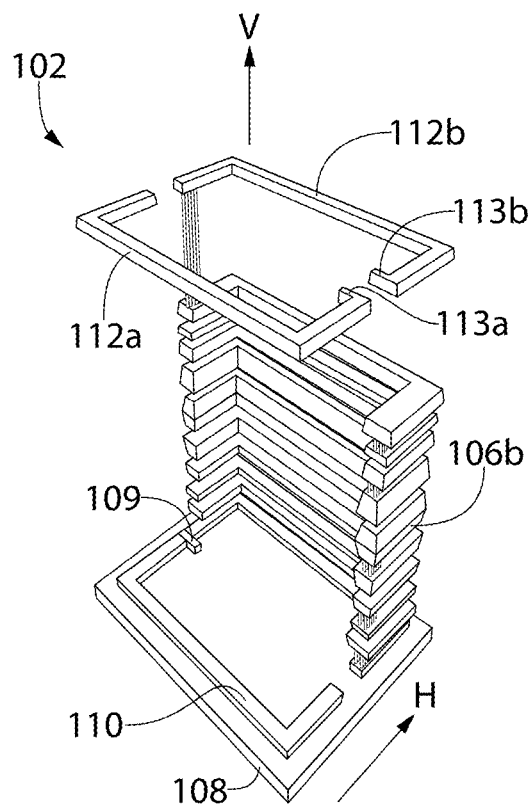

Referring to FIGS. 3-5B, there is shown a system for providing a dedicated on-die structure configured to directly detect and indicate assembly related failures. In some embodiments, the dedicated on-die structure is a multi-layer ring structure that may be associated with methods of testing NAND dies or other semiconductor devices for early detection of assembly related edge defects. Referring to FIG. 3, a schematic view of a semiconductor device e.g., NAND die 100 is shown. The NAND die 100 may include a multi-layer edge ring 102 that may be disposed interior to a seal ring 104 of the NAND die 100. In some embodiments, edge ring 102 and seal ring 104 are interior to a scribe line 105. The scribe line 105 may define a space between individual dies on a silicon wafer. In some embodiments, the multi-layer edge ring 102, also referred to as edge ring 102, may be in contact with seal ring 104. Referring to FIGS. 4A-4B, in some embodiments, the edge ring 102 may include one or more layers. In some embodiments, the edge ring 102 may include two or more layers, three or more layers, four or more layers, five or more layers, six or more layers, seven or more layers, or eight or more layers. In some embodiments, the edge ring 102 includes eight layers. In some embodiments, the edge ring 102 is configured to cover the NAND die 100 in at least one direction. In some embodiments, the edge ring 102 covers NAND die 100 in the vertical direction, indicated by arrow 'V'. In some embodiments, each layer of edge ring 102 may be divided evenly into two or more sections. In some embodiments, the edge ring 102 is comprised of one or more electrically conductive materials. In some embodiments, the layers of edge ring 102 may be comprised of any one of polysilicon, tungsten, copper, and/or aluminum. In some embodiments, each layer of edge ring 102 is comprised of the same material. In other embodiments, one or more layers of edge ring 102 may be comprised of a material that is different from another layer of edge ring 102.

In some embodiments, each layer of edge ring 102 is divided into a first section 106a and a second section 106b. In some embodiments, the first section 106a and second section 106b may cover about the same amount of area around NAND die 100. In some embodiments, the first section 106a and second section 106b are sized to extend from a bottom surface to a top surface of NAND die 100. In some embodiments, the first section 106a and second section 106b are sized to at least partially surround the side walls of NAND die 100. In some embodiments, the first section 106a is sized and shaped to extend from a bottom surface of NAND die 100 to a top surface of NAND die 100. In some embodiments, first section 106a is sized and shaped to entirely cover a first side wall of NAND die 100 and partially cover adjacent side walls. In some embodiments, second section 106b is sized and shaped to extend from a bottom surface of NAND die 100 to a top surface of NAND die 100. In some embodiments, the second section 106b is sized and shaped to entirely cover a second side wall, opposite the first side wall, of NAND die 100 and partially cover the adjacent side walls. In some embodiments, the first section 106a and second section 106b may be spaced apart from one another in the horizontal direction, indicated by arrow 'H'. In some embodiments, the space between the first section 106a, and second section 106b extends in the vertical direction. In some embodiments, the space between the first section 106a and second section 106b is along the adjacent side walls which are partially covered by the first section 106a and second section 106b. In some embodiments, first section 106a and second section 106b may include the same number of layers. In some embodiments, first section 106a may include 1 layer, 2 layers, 3 layer, 4 layers, 5 layers, 6 layers, 7 layers, 8 layers, 9 layers, 10 layers, or more than 10 layers. In some embodiments, second section 106b may include 6 layers, 7 layers, 8 layers, 9 layers, or 10 layers. In some embodiments, the first section 106a may have a different number of layers than second section 106b. For example, first section 106a may include 6 layers and second section 106b may include 7 layers. In some embodiments, each layer may have a generally trapezoidal cross-sectional shape. In other embodiments, the layers of edge ring 102 may have a generally square, generally circular, generally oval, generally rectangular, or generally hexagonal cross-sectional shape. In yet other embodiments, the layers of edge ring 102 may have a regular or irregular polygonal cross-sectional shape, curved cross-sectional shape, or other cross-sectional shape. In some embodiments, one or more layers of edge ring 102 may have a cross-sectional shape which is different than a cross-sectional shape of a different layer of edge ring 102. In some embodiments, each layer may be generally solid. In some embodiments, at least one layer may have a different surface area than the surface area of a different layer. In some embodiments, corresponding layers between the first section 106a and 106b may be generally the same. For example, the third layer of each of sections 106a and 106b may have generally the same shape and size. In some embodiments, sections 106a and 106b may be symmetrical with one another. In some embodiments, the edge ring 102 includes one or more side connections 107 disposed between each layer of edge ring 102. In some embodiments, the one or more side connections 107 are established through physical contact or through one or more via electrical connections. In some embodiments, the connections 107 alternate between different locations. For example, in FIG. 5A, the side connection 107 between the layers labeled M1 and M2 is at a rear side of edge ring 102 and the side connection 107 between the layers labeled M2 and M3 is at a front side of edge ring 102. This alternating pattern may be repeated throughout the edge ring. In some embodiments, each layer (e.g., layers MX, M0, M1, M2, M3, M3A, M2A, M1A, M01, MXA) may act as a resistor. As will be described further herein, in some embodiments the side connections 107 are configured such that the layers of first section 106a are electrically connected in a first series, and the layers of second section 106a are electrically connected in a second series.

Figure 5A:
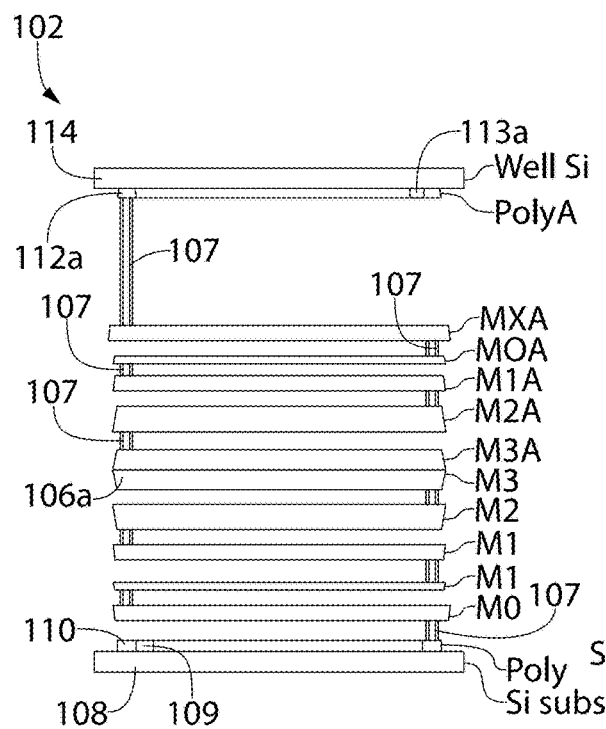
FIG. 5A is a left elevational view of the multi-layer edge ring shown in FIG. 4A.

In some embodiments, the first section 106a and second section 106b may be positioned between additional layers. In some embodiments the edge ring 102 includes a first terminal layer 110. In some embodiments, the first terminal layer is disposed above a bottom layer 108 of NAND die 100. In some embodiments, the first terminal layer 110 may be disposed between the first section 106a, second section 106b and the bottom layer 108. In some embodiments, the first terminal layer 110 may be in electrical communication with the first section 106a and second section 106b. In some embodiments, the first terminal layer 110, also labeled 'Poly' in FIGS. 5A-5B, may act as a resistor. In some embodiments, the first terminal layer 110 is connected by a side connection 107 to the one or more layers. For example, as shown in FIG. 5A, the first terminal layer 110 is connected by a side connection 107 to the layer labeled MX. In some embodiments, the first layer 110 is connected in series to the one or more layers. In some embodiments, the first terminal layer 110 may be in electrical communication with the bottom layer 108. In some embodiments, the first terminal layer 110 may include one or more terminals configured to receive a reference voltage (Vref), as discussed below. In some embodiments, the first terminal layer 110 includes a first terminal 109.

Figure 5B:
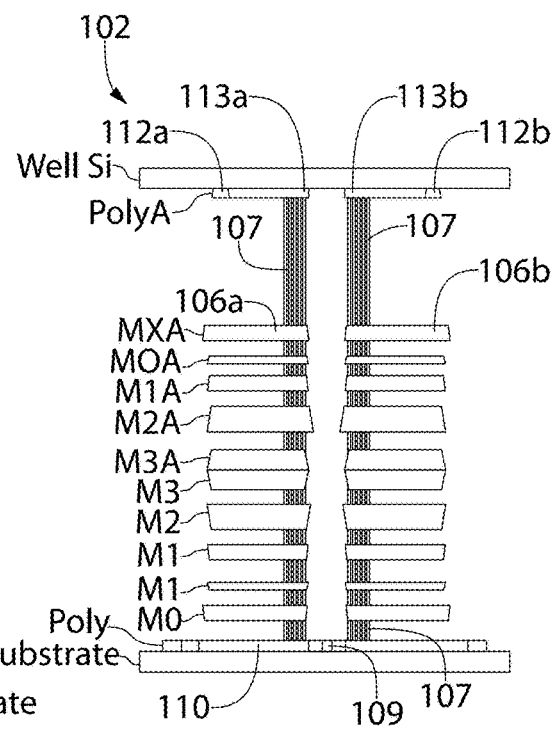
FIG. 5B is a front elevational view of the multi-layer edge ring shown in FIG. 4A.

In some embodiments, the edge ring includes a second terminal layer 112. In some embodiments, the second terminal layer 112 is disposed below a top layer 114 of NAND die 100. In some embodiments, the top layer 114 is disposed opposite the bottom layer 108. In some embodiments, the second terminal layer 112 is positioned between the first section 106a, second section 106b and top layer 114. In some embodiments, the second terminal layer 114, also labeled 'PolyA' in FIGS. 5A-5B, may act as a resistor. In some embodiments, the second terminal layer 114 is connected by one or more side connections 107 to the one or more layers. For example, as shown in FIGS. 5A and 5B, the second terminal layer 114 is connected by side connections 107 to the layer labeled MXA. In some embodiments, the second layer 114 is connected in series to the one or more layers. In some embodiments, the second terminal layer 112 is split into two or more portions. In some embodiments, the second terminal layer 112 is comprised of a left terminal layer 112a and a right terminal layer 112b. In some embodiments, the left terminal layer 112a and right terminal layer 112b may each act as a resistor. In some embodiments, the left terminal layer 112a and right terminal layer 112b may have generally the same resistance. In some embodiments, the left terminal layer 112a is connected by a side connection 107 to first section 106a. In some embodiments, left terminal layer 112a is connected in series to first section 106a. In some embodiments, the right terminal layer 112b is connected by a side connection 107 to second section 106b. In some embodiments, the right terminal layer 112b is connected in series to second section 106b. In some embodiments, the second terminal layer 112 includes one or more terminals configured to be connected to a comparator circuit 116, as discussed below. In some embodiments, the left terminal layer 112a includes a second terminal 113a. In some embodiments, the right terminal layer 112b includes a third terminal 113b. In some embodiments, the left terminal layer 112a may be in electrical communication with first section 106a. In some embodiments, right terminal layer 112b may be in electrical communication with second section 106b. In some embodiments, left terminal layer 112a and right terminal layer 112b may be in electrical communication with top layer 114. In some embodiments, left terminal layer 112a and right terminal layer 112b may contact top layer 114. In some embodiments, left terminal layer 112a may be spaced from right terminal layer 112b in the horizontal direction.

In some embodiments, the bottom layer 108 may be a silicon substrate. In some embodiments, the top layer 114 may be a silicon substrate. In some embodiments, the first terminal layer 110 is comprised of a conductive material (e.g., polysilicon). In some embodiments, the second terminal layer 112 is comprised of a conductive material (e.g., polysilicon). In some embodiments the layers forming the first section 106a and second section 106b are comprised of a conductive material (e.g., copper).

Figure 8:
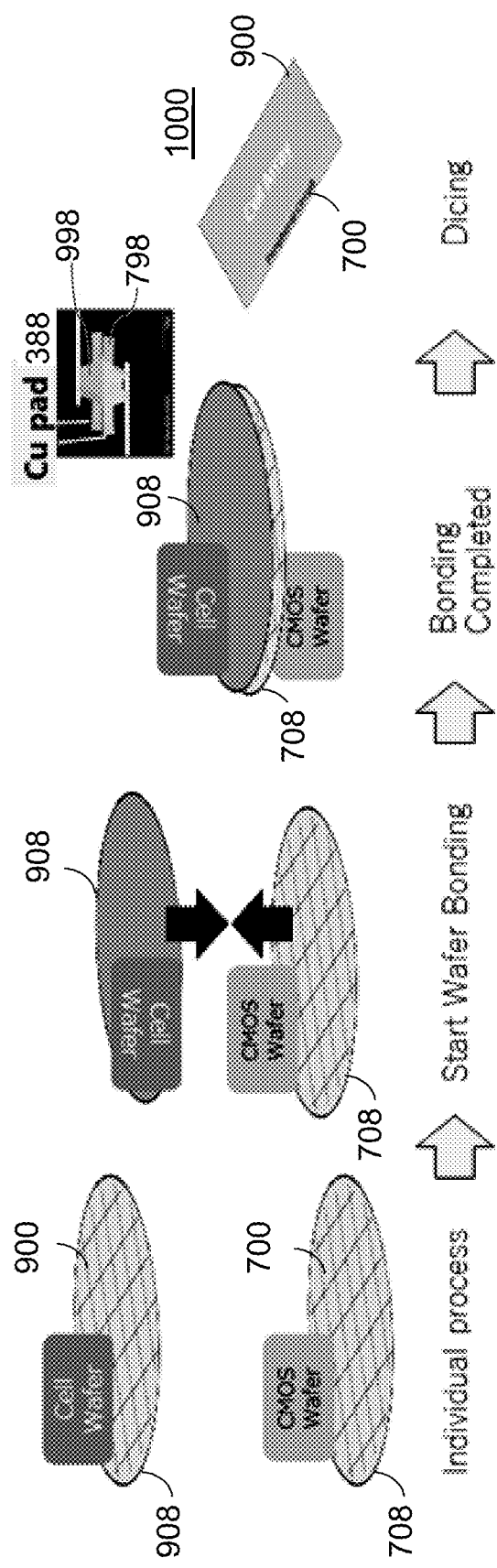
FIG. 8 is a schematic illustration of CMOS bonding array processing steps for forming bonded semiconductor devices according to an embodiment of the present disclosure.

Referring to FIGS. 5A-5B, there is shown left and front elevational views of an edge ring 102 in accordance with an exemplary embodiment of the present disclosure. In some embodiments, edge ring 102 includes side connections 107 between each layer of edge ring 102 as described above. In some embodiments, one or more of the layers of edge ring 102 may be in direct contact with another of the layers. For example, layers labeled M3 and M3A are physically and directly coupled to one another (e.g., by directly bonding the metal comprising each layer together). In some embodiments, NAND die 100 may be a 3D NAND die, which includes a control die bonded to a NAND die for performing operations on the data stored therein. In some embodiments, the 3D NAND die may be a CMOS bonded array (CBA), which includes flash memory cells on one side and CMOS logic on another side, where the flash memory cells are bonded to the CMOS logic. Referring to FIG. 8, there is shown a schematic illustration of a sequence of CBA processing steps for forming a bonded assembly and dicing the bonded assembly into semiconductor chips including a respective stack of bonded semiconductor devices (e.g., 3D NAND dies). In some embodiments, the sequence of processing steps shown in FIG. 8 may be used to form bonded semiconductor chips 1000. In some embodiments the bonded semiconductor chips 1000 include a respective bonded pair of a first semiconductor die 900 and a second semiconductor die 700. In some embodiments, the sequence may include providing a first wafer 908, the first wafer 908 including a two-dimensional array of first semiconductor dies 900. In some embodiments, each of the first semiconductor dies 900 comprises a respective set of first metal bonding pads 998. In some embodiments, the sequence includes providing a second wafer 708 including a two-dimensional array of second semiconductor dies 700. In some embodiments, the second semiconductor dies 700 comprises a respective set of second metal bonding pads 798. In some embodiments, the sequence includes starting the wafer bonding process by beginning to bond the first wafer 908 and second wafer 708. In some embodiments, the sequence includes completing the bonding process of the first wafer 908 and second wafer 708 to form the bonded assembly. In some embodiments, the sequence includes dicing the bonded assembly to produce a plurality of bonded semiconductor chips 1000.

Referring to FIGS. 5A-5B, in some embodiments, edge ring 102 may be used in a 3D NAND structure, for example, the CBA described above, for early detection of defects caused during an assembly process for the CBA. In some embodiments, the edge ring 102 may be configured to cover different areas of the NAND die 100. For example, the layers labeled PolyA to M3A may cover flash memory cells of the NAND die 100 and the layers labeled M3 to Poly may cover CMOS logic of the NAND die. Edge ring 102 is not necessarily limited to use with a CBA, and may be used with other semiconductor devices.

In some embodiments, the layers of the edge ring 102 that are directly coupled (e.g., bonded) together may act as a single resistor. In some embodiments, edge ring 102 has an overall electrical resistance. In some embodiments, the electrical resistance of edge ring 102 is used as an indicator for detecting the occurrence of assembly defects. Electrical resistance, or resistance for short, refers to the measure of the opposition to current flow in an electrical circuit. In some embodiments, the resistance of each layer of edge ring 102 may be constant when each of the layers are unbroken. A break in a layer refers to a physical separation in said layer such that the layer is separated into two or more pieces which are not electrically and/or mechanically coupled. In some embodiments, the first section 106a and second section 106b may each have an unbroken resistance value representative of the resistance of the corresponding section when there are no breaks in any layers of the respective section. In some embodiments, the unbroken resistance of first section 106a may be generally the same as the unbroken resistance of second section 106b, provided that both sections are unbroken.

In some embodiments, the edge ring 102, or one or more of the layers thereof, are configured to at least partially break in response to certain manufacturing defects during an assembly process of a NAND die 100. In some embodiments, a break in edge ring 102 causes the resistance of edge ring 102 to change. In some embodiments, at least one layer of first section 106a may break in response to an assembly defect that occurs, for example, in a portion of the seal ring that is adjacent to first section 106a. In some embodiments, at least one layer of second section 106b may break in response to an assembly defect that occurs, for example, in a portion of the seal ring that is adjacent to second section 106b. In some embodiments, in response to an assembly defect occurring, a respective layer of first section 106a and/or second section 106b may break causing the overall resistance of edge ring 102 to change. For example, if a die cracking, chipping, or peeling defect occurs and extends to a layer (e.g., layer M2) of first section 106a and/or second section 106b, the layer may break resulting in a change in the electrical resistance through that layer. In some embodiments, a break in the first section 106a, causes the resistance of the first section 106a to be a value different from the value of the unbroken resistance. In some embodiments, a break in the first section 106a causes that section to be electrical open, resulting in the resistance of first section 106a to be infinitely great. In some embodiments, a break in the second section 106b, causes the resistance of the second section 106b to be a value different from the value of the unbroken resistance. In some embodiments, a break in the second section 106b causes that section to be electrical open, resulting in the resistance of second section 106b to be infinitely great. In some embodiments, if one of sections 106a or 106b is broken while the remaining section is unbroken, the overall resistance of edge ring 102 may be changed from a first resistance value (e.g., the unbroken resistance value), to a second resistance value (e.g., a partial break resistance value). In some embodiments, the first resistance value may be different from the second resistance value. In some embodiments, the first resistance value may be less than the second resistance value. In some embodiments, the first resistance value may be about half of the second resistance value. In some embodiments, if both the first section 106a and second section 106b are broken, the resistance of edge ring 102 may change from a first resistance value (e.g., the unbroken resistance value) to a third resistance value (e.g., a complete break resistance value). In some embodiments, the first resistance value may be different than the third resistance value. In some embodiments, the first resistance value may be less than the third resistance value. In some embodiments, the third resistance value may be different than the second resistance value. In some embodiments, the second resistance value is less than the third resistance value. In some embodiments, a break in both the first section 106a and second section 106b results in the resistance of edge ring 102 being infinitely great (e.g., edge ring 102 is electrical open). In some embodiments, the resistance of the first terminal layer 110 and/or second terminal layer 112 may be included in the total resistance of the unbroken edge ring 102. In some embodiments, the first terminal layer 110 and/or second terminal layer 112 may be configured to break in response to an assembly defect.

Figure 6:
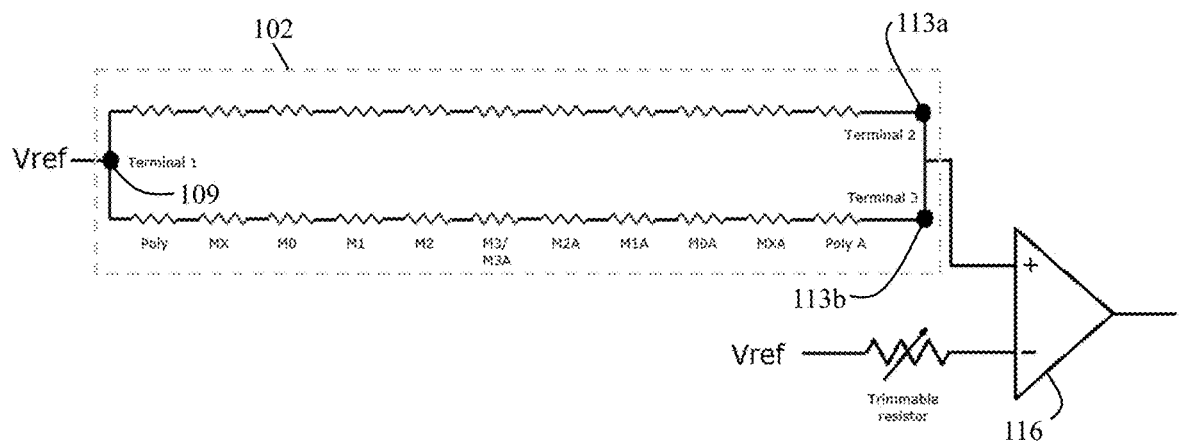
FIG. 6 is a circuit diagram for a built-in self-test path in accordance with one embodiment of the present disclosure.

In some embodiments, the change in resistance of edge ring 102 may be used to detect the occurrence of defects. Referring to FIG. 6, there is shown an embodiment of a circuit diagram for a built-in self-test in accordance with a method of the present disclosure. In some embodiments, the circuit represents the edge ring 102. In some embodiments, the circuit representing edge ring 102 includes two paths. In some embodiments each path represents the two sections 106a, 106b respectively as well as the first and second terminal layers 110, 112. For example, the path leading from the first terminal 109 to the second terminal 113a represents the first terminal 110, first section 106a and left terminal layer 112a connected in series. The path leading from the first terminal 109 to the third terminal 113b represents the first terminal 110, second sections 106b and right terminal layer 112b connected in series. In some embodiments, each resistor in the circuit representing edge ring 102 represents a different layer of the one or more layers. In some embodiments, a reference voltage (Vref) is applied to the edge ring 102. In some embodiments, Vref is applied to a first terminal 109 of edge ring 102. In some embodiments, the second terminal 113a and third terminal 113b are shorted together. In some embodiments, the shorted second and third terminals 113a, 113b are connected to an input end of a comparator circuit 116. In some embodiments, the comparator circuit 116 is on chip. In some embodiments, a reference input end of the comparator circuit 116 includes a trimmable resistor (e.g., resistor ladder). In some embodiments, the resistance value of the trimmable resistor may be trimmed to be less than the unbroken resistance of edge ring 102. In some embodiments, the resistance of edge ring 102 when unbroken may be less than a predetermined threshold resistance, resulting in the voltage of the input from the edge ring 102 to the comparator circuit 116 to be greater than the voltage from the reference input. In some embodiments, when the edge ring 102 is unbroken, the comparator circuit 116 may output a first value (e.g., a '1'). In some embodiments, if an assembly defect occurs the edge ring 102 may experience a break in the first section 106a and/or second section 106b. As discussed above, a break in the first section 106a and/or second section 106b causes the overall resistance of the edge ring 102 to change. In some embodiments, the resistance of the edge ring 102 increases in response to a break caused by an assembly defect. In some embodiments, the increase in resistance of edge ring 102 causes the input voltage to the comparator circuit 116 to be less than the reference voltage of the comparator circuit 116 causing the comparator circuit 116 to output a second value. The second value may be different from the first value (e.g., a '0'). This method may be used to return a pass/fail status to detect the occurrence of assembly edge defects. For example, a comparator value of '0' may be a fail indicating that the edge ring 102 has broken, and a comparator value of '1' may be a pass indicating that the edge ring 102 is intact.

Figure 7:
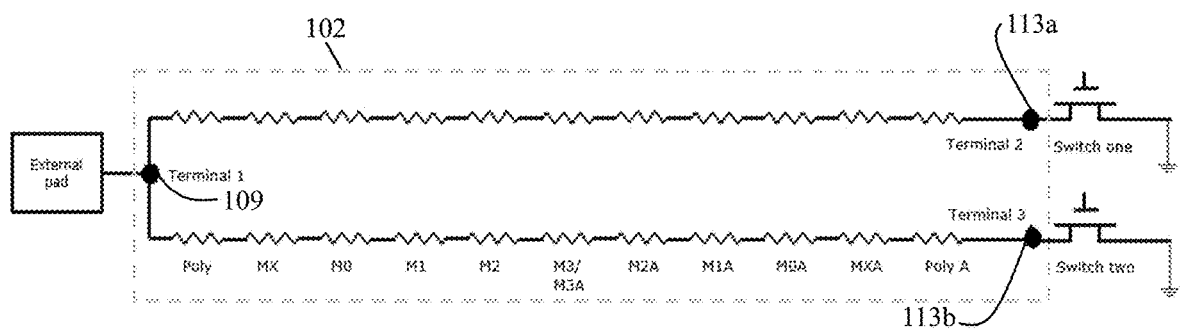
FIG. 7 is a circuit diagram for an external test path in accordance with another embodiment of the present disclosure.

Referring to FIG. 7, there is shown another embodiment of a circuit diagram for an external test path in accordance with a method of the present disclosure. In some embodiments, an external pad is connected to a side of the edge ring 102. In some embodiments, the external pad is connected to the first terminal 109 of edge ring 102. In some embodiments the external pad is configured to provide a voltage to the edge ring 102 (e.g., Vmon, Vpp). In some embodiments, the external pad includes terminals configured to be connected to the first terminal 109. In some embodiments, another side of edge ring 102 is connected to a ground. In some embodiments, the external pad may be configured to measure a first half of the edge rings 102 resistance separate from the second half of the edge ring 102. For example, the external pad may measure the resistance corresponding to the first section 106a of edge ring 102. In some embodiments, the external pad may be configured to determine a first resistance value corresponding to the resistance of the first section 106a. In some embodiments, the external pad may measure the resistance of the second section 106b separate from the first section 106a. In some embodiments, the external pad may be configured to determine a second resistance value corresponding to the resistance of the second section 106b. In some embodiments, the external pad may be configured to compare the first resistance value to the second resistance value. In some embodiments, the external pad may compare the difference between the first resistance value and the second resistance value to a predetermined maximum difference. In some embodiments, if the difference between the first resistance value and second resistance value exceeds the predetermined maximum difference, it may indicate that an assembly related defect occurred on one side of the edge ring 102. In some embodiments, if both the first resistance value and second resistance value exceed a predetermined maximum value, it may indicate that an assembly defect occurred on both sides of edge ring 102. The external pad may include a tester phasor measurement unit (PMU) to measure the resistance of the first section 106a and second section 106b separately.

It will be appreciated by those skilled in the art that changes could be made to the exemplary embodiments shown and described above without departing from the broad inventive concepts thereof. It is understood, therefore, that the present disclosure is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. The words "inwardly" and "outwardly" refer to directions toward and away from, respectively, the geometric center of the edge ring. Unless specifically set forth herein, the terms "a", "an" and "the" are not limited to one element but instead should be read as meaning "at least one".

It is to be understood that at least some of the figures and descriptions of the present disclosure have been simplified to focus on elements that are relevant for a clear understanding of the disclosed embodiments, while eliminating, for purposes of clarity, other elements that those of ordinary skill in the art will appreciate may also comprise a portion of the present embodiments. However, because such elements are well known in the art, and because they do not necessarily facilitate a better understanding of the disclosed embodiments, a description of such elements is not provided herein.

Further, to the extent that the methods of the present disclosure do not rely on the particular order of steps set forth herein, the particular order of the steps should not be construed as limitation on the claims. Any claims directed to the methods of the present disclosure should not be limited to the performance of their steps in the order written, and one skilled in the art can readily appreciate that the steps may be varied and still remain within the spirit and scope of the present disclosure.

What is claimed is:

1. An apparatus for detecting the presence of defects on a semiconductor device, the apparatus comprising:
    an edge ring having a resistance value, wherein a change in the resistance value indicates a defect on the semiconductor device, the edge ring comprising:
        a first terminal layer defining a bottom layer of the edge ring and including a first terminal;
        a second terminal layer defining a top layer of the edge ring and including a second terminal and a third terminal;
        one or more conductive layers positioned between the first terminal layer and second terminal layer and configured to at least partially cover the semiconductor device in a first direction, the one or more conductive layers divided into a first section and a second section,
    wherein there is a first electrical path defined by the first section electrically connected in series to the first terminal and the second terminal,
    wherein there is a second electrical path defined by the second section electrically connected in series to the first terminal and the third terminal,
    wherein the first electrical path and second electrical path are electrically connected in parallel,
    wherein the resistance value of the edge ring has a first resistance value associated with the first and second sections being intact, at least one of the first section and second section configured to break in response to an assembly related defect, and
    wherein, the resistance value of the edge ring is configured to change from the first resistance value to a second resistance value in response to at least one of the first and second sections being broken.

2. The apparatus of claim 1, wherein the second resistance value is greater than the first resistance value.

3. The apparatus of claim 1, wherein the second resistance value is about double the first resistance value.

4. The apparatus of claim 1, wherein the resistance value of the edge ring is configured to change from the first resistance value to a third resistance value in response to the first and second sections being broken.

5. The apparatus of claim 4, wherein the third resistance value is greater than the first resistance value.

6. The apparatus of claim 1, wherein the semiconductor device is a 3D NAND.

7. The apparatus of claim 6, wherein the 3D NAND is a CMOS bonded array.

8. The apparatus of claim 7, wherein the CMOS bonded array includes a CMOS logic die bonded to a NAND die.

9. The apparatus of claim 1, wherein the one or more conductive layers comprise one or more of polysilicon, tungsten, copper, and aluminum.

10. An apparatus for detecting the presence of assembly related defects on a semiconductor device, the apparatus comprising:
- a first terminal means for providing an electrical connection to a power source, the first terminal means defining a bottom layer of the apparatus and including a first terminal;
- a second terminal means for providing electrical connections to electrical measurement means for measuring an electrical resistance, the second terminal means defining a top layer of the apparatus and including a second and third terminal; and
- a conductive enclosure means for at least partially covering the semiconductor device in at least one direction, the conductive enclosure means positioned between the first terminal means and the second terminal means and having a resistance value, the enclosure means including a first section and a second section at least one of which configured to break in response to an assembly related defect;
- wherein there is a first electrical path defined by the first section electrically connected in series to the first terminal and the second terminal,
- wherein there is a second electrical path defined by the second section electrically connected in series to the first terminal and the third terminal,
- wherein the first electrical path and second electrical path are electrically connected in parallel,
- wherein the resistance value of the enclosure means has a first resistance value associated with the first and second sections of the conductive enclosure means being intact, and
- wherein, the resistance value of the enclosure means is configured to change from the first resistance value to a second resistance value in response to at least one of the first and second sections of the conductive enclosure means being broken.

11. The apparatus of claim 10, wherein the second resistance value is greater than the first resistance value.

12. The apparatus of claim 10, wherein the second resistance value is about double the first resistance value.

13. A method of detecting assembly related defects of a semiconductor device, the method comprising the steps of:
- providing an edge ring having a resistance value, the edge ring comprising:
  - a first terminal layer defining a bottom layer of the edge ring and including a first terminal;
  - a second terminal layer defining a top layer of the edge ring and including a second terminal and a third terminal;
  - one or more conductive layers positioned between the first terminal layer and second terminal layer and configured to at least partially cover the semiconductor device in a first direction, the one or more conductive layers divided into a first section and a second section,
  - wherein there is a first electrical path defined by the first section electrically connected in series to the first terminal and the second terminal,
  - wherein there is a second electrical path defined by the second section electrically connected in series to the first terminal and the third terminal,
  - wherein the first electrical path and second electrical path are electrically connected in parallel,
  - wherein the resistance value of the edge ring has a first resistance value associated with the first and second sections being intact, at least one of the first section and second section configured to break in response to an assembly related defect, and
  - wherein, the resistance value of the edge ring is configured to change from the first resistance value to a second resistance value in response to at least one of the first and second sections being broken;
- determining whether the resistance value of the edge ring has changed;
- in response to determining that the resistance value of the edge ring has not changed:
  - determining that no assembly defect has occurred on the semiconductor device; and
- in response to determining that the resistance value of the edge ring has changed:
  - determining that an assembly defect has occurred on the semiconductor device.

14. The method of claim 13, wherein the semiconductor device includes a circuit configured to determine the measured resistance value.

15. The method of claim 13, wherein the method further comprises:
- providing an external pad and applying a voltage to the external pad for determining the resistance value, the external pad being external to the semiconductor device.

* * * * *